United States Patent
Yin et al.

(10) Patent No.: US 11,953,629 B2
(45) Date of Patent: Apr. 9, 2024

(54) LIGHT SENSOR AND RANGING METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 521 days.

(21) Appl. No.: 17/367,443

(22) Filed: Jul. 5, 2021

(65) Prior Publication Data

US 2022/0011412 A1 Jan. 13, 2022

Related U.S. Application Data

(60) Provisional application No. 63/058,502, filed on Jul. 30, 2020, provisional application No. 63/050,120, filed on Jul. 10, 2020.

(51) Int. Cl.
*G01S 7/4865* (2020.01)
*G01J 1/44* (2006.01)
(Continued)

(52) U.S. Cl.
CPC ............ *G01S 7/4865* (2013.01); *G01J 1/44* (2013.01); *G01S 7/4814* (2013.01); *G01S 7/4816* (2013.01); *G01S 7/484* (2013.01); *G01S 7/4863* (2013.01); *G01S 17/10* (2013.01); *G01S 17/14* (2020.01); *G04F 10/005* (2013.01); *H01L 27/1446* (2013.01); *H01L 27/14609* (2013.01); *H01L 31/107* (2013.01); *G01J 2001/442* (2013.01); *G01J 2001/444* (2013.01); *G01J 2001/4466* (2013.01); *G01J 2001/448* (2013.01)

(58) Field of Classification Search
CPC .... G01S 7/4865; G01S 7/4814; G01S 7/4816; G01S 7/484; G01S 7/4863; G01S 17/10; G01S 17/14; G01S 7/4861; G01S 7/4868; G01S 7/497; G01S 17/08; G01J 1/44; G01J 2001/442; G01J 2001/444; G01J 2001/4466; G01J 2001/448; G04F 10/005; H01L 27/1446; H01L 27/14609; H01L 31/107; H01L 31/02027
See application file for complete search history.

(56) References Cited

U.S. PATENT DOCUMENTS

| | | | |
|---|---|---|---|
| 11,366,205 B2* | 6/2022 | Ikuta | G01S 7/4861 |
| 11,644,547 B2* | 5/2023 | Yin | G01S 7/4861 |
| | | | 356/5.01 |

\* cited by examiner

*Primary Examiner* — Seung C Sohn
(74) *Attorney, Agent, or Firm* — JCIPRNET

(57) ABSTRACT

A light sensor and a ranging method are provided. The light sensor includes a light source, a sensing sub-pixel, and a control circuit. The sensing sub-pixel includes a diode. The control circuit operates the diode in a Geiger mode or an avalanche linear mode. The control circuit includes a time-to-digital converter, and the time-to-digital converter includes a counting circuit. The counting circuit includes a plurality of counting units. When the time-to-digital converter receives a sensing signal provided by the sensing sub-pixel, the control circuit generates a plurality of count values according to the sensing signal through the counting units of the counting circuit, where the count values are histogram data corresponding to a distance sensing result.

20 Claims, 10 Drawing Sheets

(51) Int. Cl.
*G01S 7/481* (2006.01)
*G01S 7/484* (2006.01)
*G01S 7/4863* (2020.01)
*G01S 17/10* (2020.01)
*G01S 17/14* (2020.01)
*G04F 10/00* (2006.01)
*H01L 27/144* (2006.01)
*H01L 27/146* (2006.01)
*H01L 31/107* (2006.01)

LIGHT SENSOR AND RANGING METHOD

CROSS-REFERENCE TO RELATED APPLICATION

This application claims the priority benefit of U.S. provisional application Ser. No. 63/050,120, filed on Jul. 10, 2020, and U.S. provisional application Ser. No. 63/058,502, filed on Jul. 30, 2020. The entirety of each of the above-mentioned patent applications is hereby incorporated by reference herein and made a part of this specification.

BACKGROUND

Technical Field

The disclosure relates to a sensing technique, and particularly relates to a light sensor and a ranging method.

Description of Related Art

Currently, there are many demands for applications of high-sensitivity ranging sensors in various fields, such as the medical field and the automotive industry. Particularly, light sensors for sensing extremely weak light are the current mainstream in sensor design. However, the ranging result of the ranging sensor at this time is limited by the bin resolution (or referred to as grid resolution) of a digital converter 330, so that it is barred from providing ranging results with higher precision. In this light, solutions with several embodiments are provided below to provide a light sensor with high precision and capable of sensing the extremely weak light effectively.

SUMMARY

The disclosure is directed to a light sensor and a ranging method, which are capable of providing a ranging result with high precision.

The disclosure provides a light sensor including a light source, a sensing sub-pixel and a control circuit. The sensing sub-pixel includes a diode. The control circuit is coupled to the light source and the sensing sub-pixel, and is configured to operate the diode in a Geiger mode or an avalanche linear mode. The control circuit includes a time-to-digital converter, and the time-to-digital converter includes a counting circuit. The time-to-digital converter is coupled to the diode. The counting circuit is coupled to the time-to-digital converter, and includes a plurality of counting units. When the time-to-digital converter receives a sensing signal provided by the sensing sub-pixel, the control circuit generates a plurality of counting values according to the sensing signal through the counting units of the counting circuit, where the counting values are histogram data corresponding to a distance sensing result.

The disclosure provides a ranging method including following steps: operating a diode of a sensing sub-pixel in a Geiger mode or an avalanche linear mode; emitting ranging light by a light source; sensing reflected light corresponding to the ranging light through the sensing sub-pixel; when a time-to-digital converter receives a sensing signal provided by the sensing sub-pixel, generating a plurality of counting values according to the sensing signal through a plurality of counting units of a counting circuit, where the counting values are histogram data corresponding to a distance sensing result.

Based on the above description, the light sensor and the ranging method of the disclosure are adapted to directly store the sensing data output by the time-to-digital converter as histogram data corresponding to the distance sensing result, so as to effectively save a memory space.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
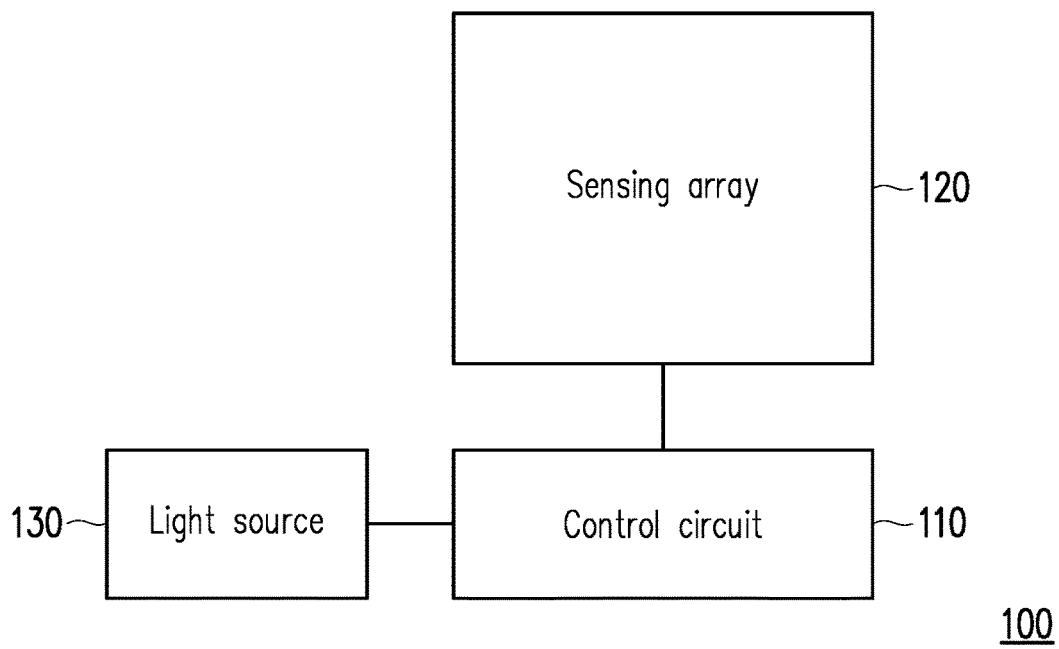
FIG. 1 is a schematic structural diagram of a light sensor according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
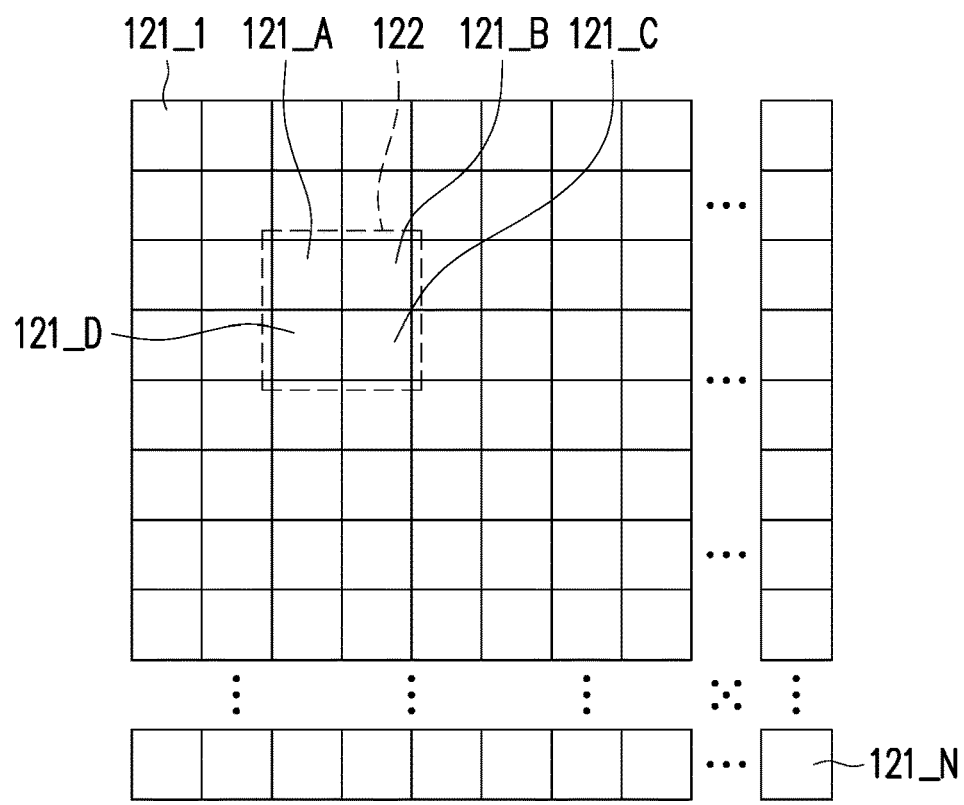
FIG. 2 is a schematic diagram of a sensing array according to an embodiment of the disclosure.

FIG. 1 is a schematic structural diagram of a light sensor according to an embodiment of the disclosure. FIG. 2 is a schematic diagram of a sensing array according to an embodiment of the disclosure. Referring to FIG. 1 and FIG. 2, the light sensor 100 includes a control circuit 110, a sensing array 120 and a light source 130. The control circuit 110 is coupled to the sensing array 120 and the light source 130. The sensing array 120 includes a plurality of sensing sub-pixels 121_1-121_N, where N is a positive integer. Each of the sensing sub-pixels 121_1-121_N includes at least one diode (a photodiode). The diode may be a p-n junction diode. In the embodiment, the control circuit 110 may control the sensing array 120 to operate the diodes in the sensing sub-pixels 121_1-121_N in a Geiger mode or an avalanche linear mode to perform a light sensing operation.

In the embodiment, the light source 130 may be an infrared laser light source, but the disclosure is not limited thereto. In other embodiments of the disclosure, the light source 130 may be a visible light source or an invisible light source. In the embodiment, the control circuit 110 may respectively operate the plurality of diodes of the sensing sub-pixels 121_1-121_N to be in a single-photon avalanche diode (SPAD) state of the Geiger mode or the avalanche linear mode to range a ranging light (pulse light) emitted by the light source 130, so as to achieve a ranging sensing function with low light quantity and high sensing sensitivity characteristics.

In the embodiment, the control circuit 110 may be, for example, an internal circuit or a chip of the light sensor, and includes a digital circuit element and/or an analog circuit element. The control circuit 110 may control an operation mode of the diodes in the sensing sub-pixels 121_1-121_N and/or an operation mode of the sensing sub-pixels 121_1-121_N by changing a bias voltage of the diodes in the sensing sub-pixels 121_1-121_N and/or a control voltage of a plurality of transistors. The control circuit 110 may control the light source 130 to emit the ranging light, and may perform related signal processing and sensing data calculations on sensing signals output by the sensing sub-pixels 121_1-121_N. In some other embodiments of the disclosure, the control circuit 110 may also be, for example, an external circuit or chip of the light sensor, such as a central processing unit (CPU), a microprocessor control unit (MCU) or a field programmable gate array (FPGA) of a certain terminal device, etc., or other similar processing circuits or control circuits, but the disclosure is not limited thereto.

Figure 3:
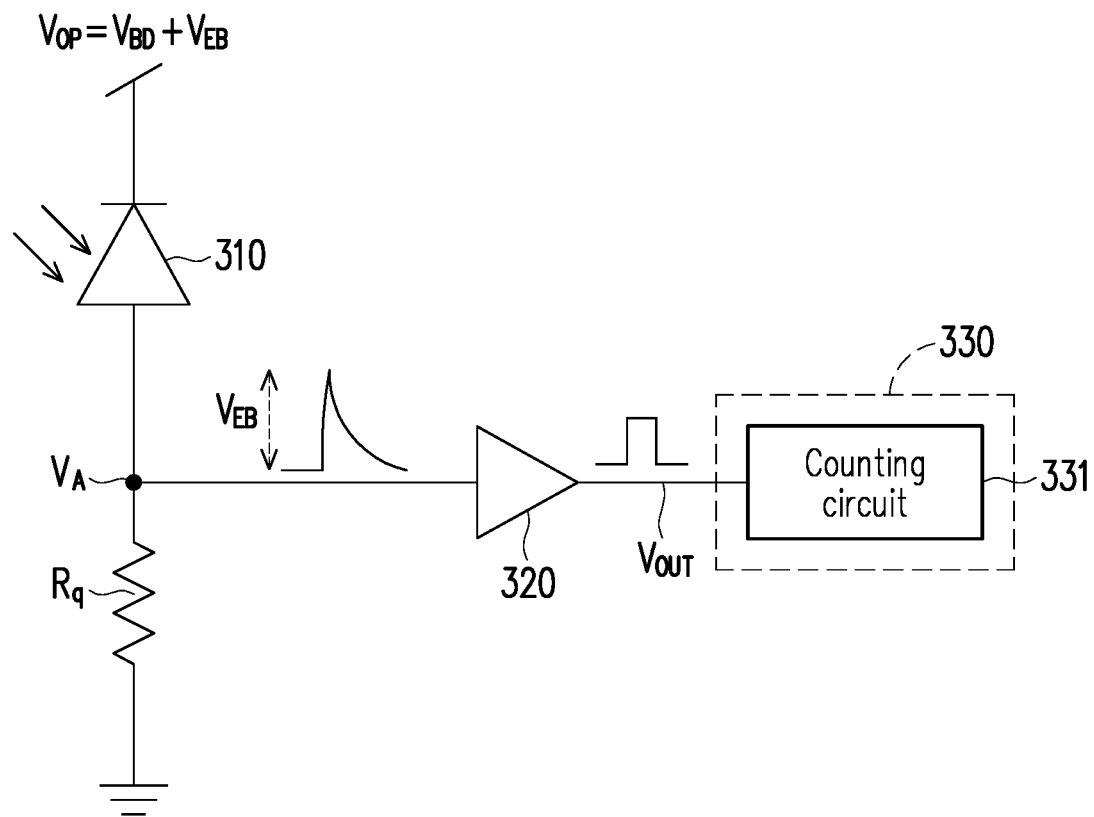
FIG. 3 is a schematic circuit diagram of a sensing sub-pixel and a control circuit according to an embodiment of the disclosure.

FIG. 3 is a schematic circuit diagram of a sensing sub-pixel and a control circuit according to an embodiment of the disclosure. Referring to FIG. 3, in FIG. 3, one sensing sub-pixel is taken as an example for description, and the sensing sub-pixel and the control circuit of the embodiment may be applied to the sensing sub-pixels and a part of internal components or circuits of the control circuit of various embodiments of the disclosure. The sensing sub-pixel includes a diode 310 and a quenching resistor Rq. The control circuit includes an amplifier 320 and a time-to-digital converter 330. The time-to-digital converter 330 includes a counting circuit 331 and a memory 332. In the embodiment, a first end of the diode 310 is coupled to an operating voltage $V_{OP}$ ($V_{OP}=V_{BD}\pm V_{EB}$), where $V_{BA}$ is a breakdown voltage, and $V_{EB}$ is an excess bias voltage. The quenching resistor Rq is coupled between a second end of the diode 310 and a ground terminal voltage. There is a node voltage $V_A$ between the quenching resistor Rq and the second end of the diode 310. An input terminal of the amplifier 320 is coupled to the second end of the diode 310. An output terminal of the amplifier 320 is coupled to the time-to-digital converter 330. In the embodiment, the control circuit (such as the control circuit 110 in FIG. 1) may control a bias voltage of the diode 310, so that the diode 310 operates in the Geiger mode or the avalanche linear mode to receive ranging light emitted by a specific light source (such as the light source 130 in FIG. 1). In this regard, when the diode 310 senses a single photon or several photons (minor photons) of the ranging light, the input terminal of the amplifier 320 may receive a sensing signal provided by the diode 310, where the sensing signal may be a single photon sensing signal. In addition, the output terminal of the amplifier 320 may output an amplified sensing signal $V_{OUT}$ to the time-to-digital converter 330, where the amplified sensing signal $V_{OUT}$ may be, for example, a square wave pulse signal.

In the embodiment, the time-to-digital converter 330 may directly transmit the square wave pulse signal to a plurality of counting units in the counting circuit 331, and a plurality of counting values of the counting circuit 331 are histogram data corresponding to a distance sensing result. In other words, the time-to-digital converter 330 of the embodiment does not need to store data of a plurality of digital number values of the distance sensing result first, and generate histogram data based on the data of the plurality of digital number values (DN values), and then save the histogram data (i.e. two steps). The time-to-digital converter 330 of the embodiment may directly generate the histogram data of the distance sensing result (i.e. one step). Therefore, the time-to-digital converter 330 of the embodiment may effectively save a memory space during a data processing process of generating the histogram data. The counting circuit 331 may be directly used as a memory unit to store the histogram data. According to another aspect, the time-to-digital converter 330 of the embodiment only requires a small data storage space, which may effectively reduce the hardware cost of the internal memory.

Figure 4:
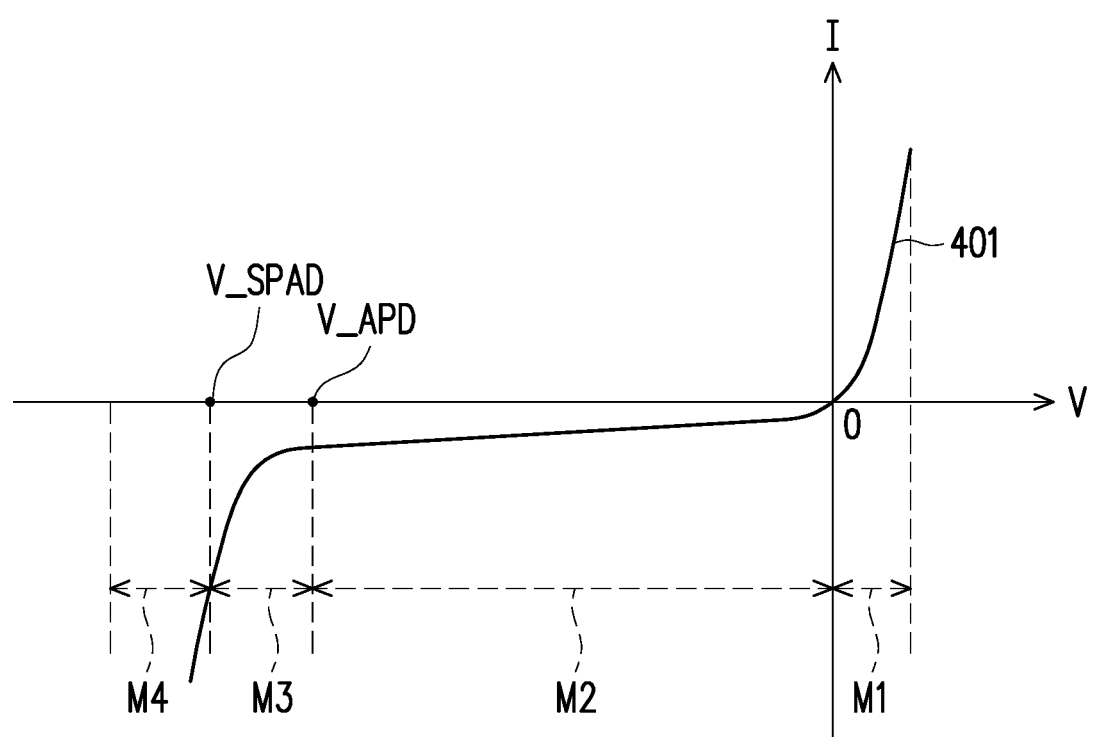
FIG. 4 is a characteristic curve diagram of a diode according to an embodiment of the disclosure.
Figure 5:
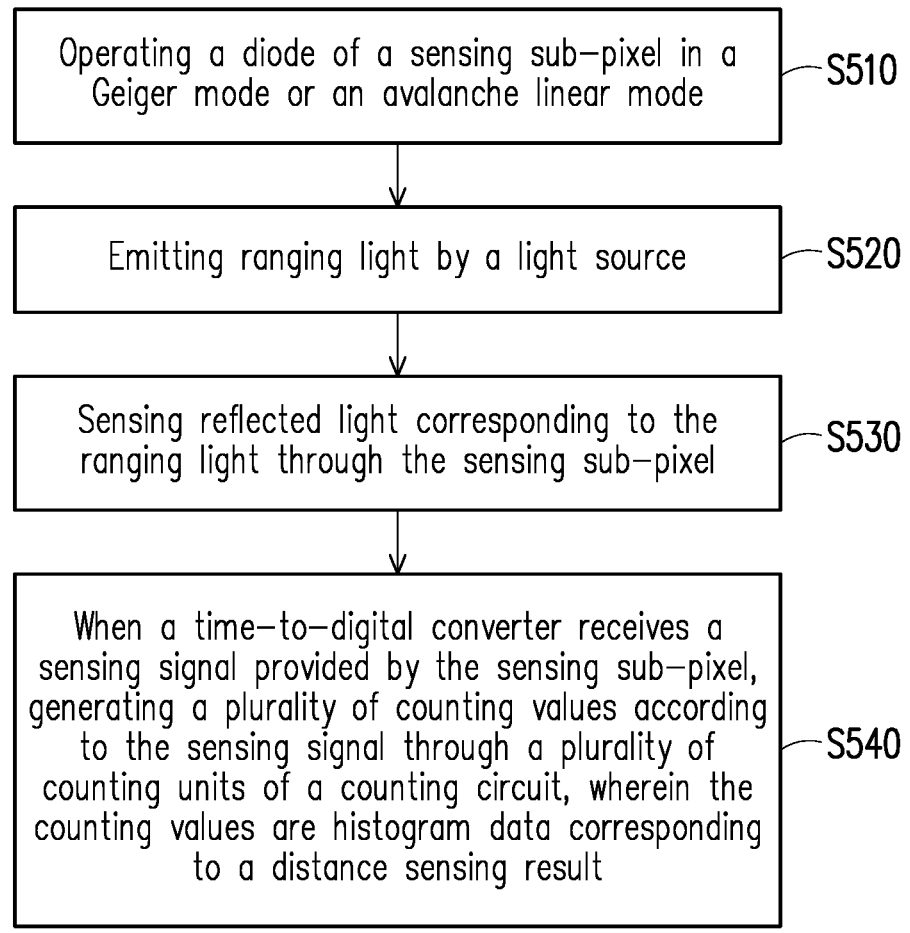
FIG. 5 is a flowchart of a ranging method according to an embodiment of the disclosure.

FIG. 4 is a characteristic curve diagram of a diode according to an embodiment of the disclosure. FIG. 5 is a flowchart of a ranging method according to an embodiment of the disclosure. Referring to FIG. 1, FIG. 2 and FIG. 4, the diode of the sensing sub-pixel in this embodiment may have a characteristic curve 401 as shown in FIG. 4. A horizontal axis of FIG. 4 represents a bias voltage V of the diode, and a vertical axis represents a current I that is generated by the diode under the corresponding bias voltage due to photoelectric conversion. When the bias voltage V of the diode is greater than 0 (shown as a voltage range M1 in FIG. 4), the diode may be operated in a solar cell mode. When the bias voltage V of the diode is between 0 and an avalanche voltage V_APD (shown as a voltage range M2 in FIG. 4), the diode may be operated in a photodiode mode. When the bias voltage V of the diode is between the avalanche voltage V_APD and a breakdown voltage V_SPAD (shown as a voltage range M3 in FIG. 4), the diode may be operated in an avalanche linear mode. When the bias voltage V of the diode is less than the breakdown voltage V_SPAD (shown as a voltage range M4 in FIG. 4), the diode may be operated in the Geiger mode. In the embodiment, the control circuit 110 controls the bias voltages of the plurality of diodes of the sensing sub-pixels 121_1-121_N, so that the plurality of diodes are operated in the Geiger mode or the avalanche linear mode to receive the ranging light emitted by the light source 130.

FIG. 5 is a flowchart of a ranging method according to an embodiment of the disclosure. Referring to FIG. 1, FIG. 3 and FIG. 5, the light sensor 100 of the disclosure may execute the following steps S510-S550 to perform ranging. In step S510, the control circuit 110 may operate the diode 310 of the sensing sub-pixel to operate in the Geiger mode or the avalanche linear mode. In step S520, the control circuit 110 may control the light source 130 to emit ranging light. In step S530, the control circuit 110 may sense reflected light corresponding to the ranging light through the diode 310 of the sensing sub-pixel. In step S540, when the time-to-digital converter 330 receives a sensing signal provided by the diode 310 of the sensing sub-pixel, the time-to-digital converter 330 generates a plurality of counting values according to the sensing signal through a plurality of counting units of the counting circuit 331, where the plurality of counting values are histogram data corresponding to the distance sensing result. Namely, the plurality of counting units of the counting circuit 331 simultaneously serve as time-to-digital conversion (TDC) units and memory units. Therefore, the ranging method of the embodiment may effectively save memory space in the data processing process that the time-to-digital converter 330 generates the histogram data.

Figure 6:
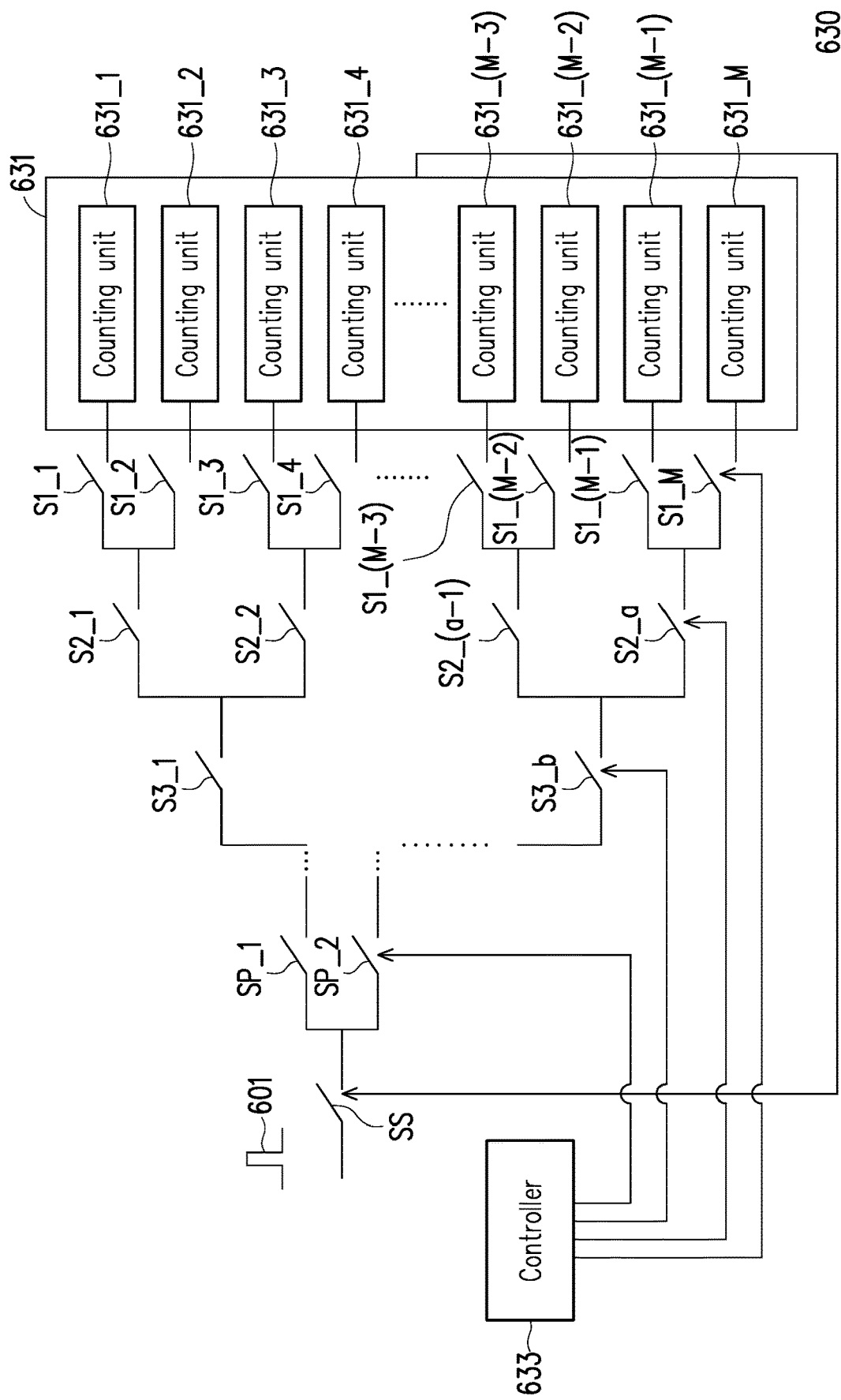
FIG. 6 is a schematic circuit diagram of a time-to-digital converter according to an embodiment of the disclosure.

FIG. 6 is a schematic circuit diagram of a time-to-digital converter according to an embodiment of the disclosure. Referring to FIG. 6, step S540 of the above embodiment of FIG. 5 may be implemented by a circuit framework shown in FIG. 6, and the time-to-digital converter 330 of FIG. 3 may further include a framework of a time-to-digital converter 630 shown in FIG. 6. The sensing result of one sensing sub-pixel is taken as an example for description, so that the overall sensing result of the sensing array may be deduced by analogy as described below. In the embodiment, the time-to-digital converter 630 includes a controller 633, a first switch SS, a plurality of second switches S1_1-S1_M, S2_1-S2_a, S3_1-S2_b, SP_1, SP_2, and a counting circuit 631, where M, a, b, and P are positive integers. In the embodiment, the second switches S1_1-S1_M, S2_1-S2_a, S3_1-S2_b, SP_1-SP_2 may be coupled to form a tree structure as shown in FIG. 6, but the disclosure is not limited thereto. A first terminal of the first switch SS is coupled to the sensing sub-pixel (for example, coupled to the output terminal of the amplifier 320 in FIG. 3). A second terminal of the first switch SS is coupled to first terminals of the second switches SP_1-SP_2, and second terminals of the second switches S1_1-S1_M are coupled to a plurality of counting units 631_1-631_M of the counting circuit 631. The counting units 631_1-631_M may be up counters.

In the embodiment, the counting circuit 631 may output a first switching signal to the first switch SS to turn on the first switch SS to start a counting operation, and when the counting circuit 631 obtains a counting result of one sensing signal, the counting circuit 631 turns off the first switch SS, so that the counting circuit 631 stops counting and outputs the histogram data. In addition, the controller 633 may output a plurality of second switching signals to turn on at least one of the second switches S1_1-S1_M, S2_1-S2_a, S3_1-S2_b, SP_1, SP_2, so that a sensing signal 601 is written into one of the counting units 631_1-631_M, where the sensing signal 601 described in the embodiment may refer to a single photon sensing signal or a square wave pulse signal as described above.

Figure 7:
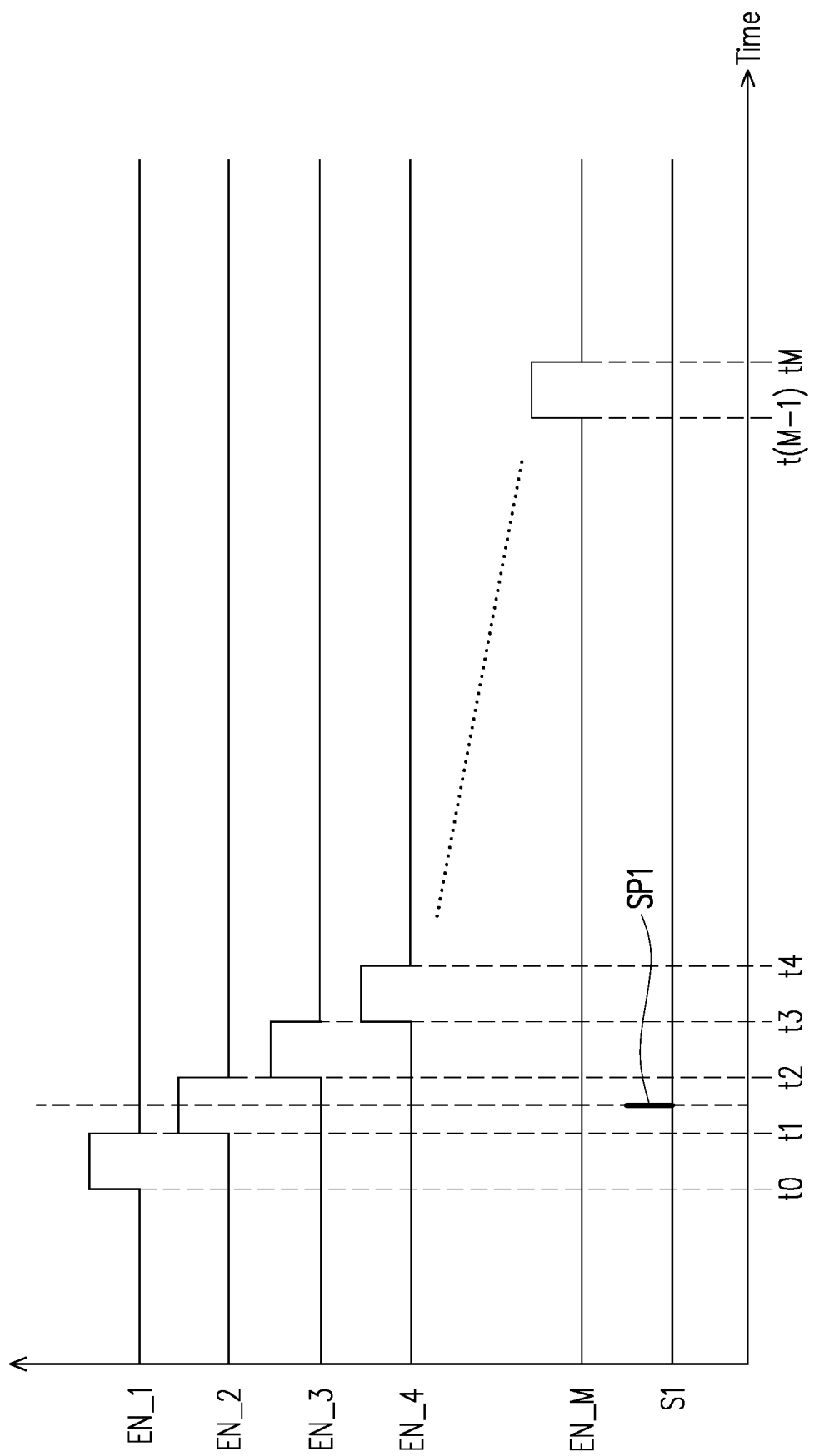
FIG. 7 is a signal timing diagram of a plurality of second switching signals and sensing signals according to an embodiment of the disclosure.

Referring to FIG. 7, FIG. 7 is a signal timing diagram of a plurality of second switching signals and sensing signals according to an embodiment of the disclosure. Taking a single photon sensing signal as an example, the controller 633 of the time-to-digital converter 630 may output a plurality of second switching signals to the second switches S1_1-S1_M, S2_1-S2_a, S3_1-S2_b, SP_1, SP_2, where the second switches S1_1-S1_M may receive second switching signals EN_1-EN_M as shown in FIG. 7. In this way, in collaboration with operations of other second switches, a plurality of signal transmission paths between the counting units 631_1-631_M and the first switch SS may be sequentially closed in different periods. For example, the signal transmission path between the counting unit 631_1 and the first switch SS may be closed during a period from a time point t0 to a time point t1. The signal transmission path between the counting unit 631_2 and the first switch SS may be closed during a period from a time point t1 to a time point t2. Deduced by analogy, the signal transmission path between the counting unit 631_M and the first switch SS may be closed during a period from a time point t(M−1) to a time point tM. There are equal time intervals between adjacent time points from the time point t0 to the time point tM. In this regard, when the first switch SS receives a sensing signal SP1 provided by the diode of the sensing sub-pixel during the period from the time point t1 to the time point t2. The counting unit 631_2 may increase the counting value (the counting value+1) according to the pulse SP1 of the single photon sensing signal S1.

Figure 8:
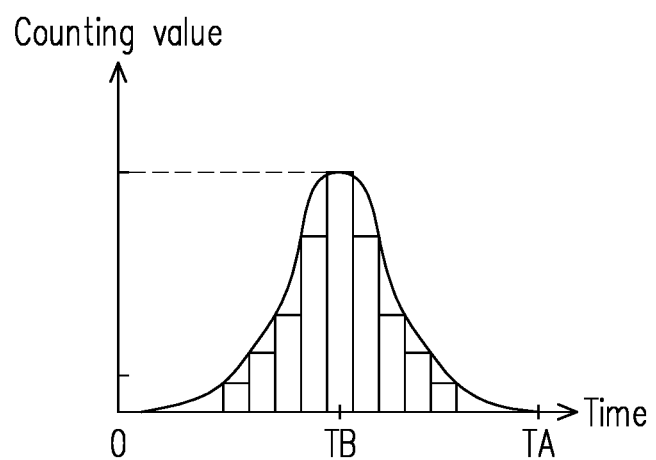
FIG. 8 is a histogram of a distance sensing result according to an embodiment of the disclosure.

Referring to FIG. 8, FIG. 8 is a histogram of a distance sensing result according to an embodiment of the disclosure. The time-to-digital converter 630 may perform the counting operation as shown in the signal timing diagram of FIG. 7 on a plurality of sensing signals respectively having a single photon or several photons (minor photons) sequentially received corresponding to one ranging light. When the counting circuit 631 determines that any counting unit reaches a predetermined value or a counting time length reaches a predetermined time length, the counting circuit 631 may turn off the first switch SS, and directly store the counting results of the counting units 631_1-631_M as the histogram data corresponding to the distance sensing result as shown in FIG. 8. The histogram shown in FIG. 8 may be a counting result of the counting circuit 631 during a counting time length of a period from time points 0 to TA, and the histogram has the highest counting value at a time point TB. The light sensor may calculate a distance value of a current sensing object according to the time point TB. For another example, the number of the counting units 631_1 to 631_M may be 256. Therefore, the time-to-digital converter 630 of the embodiment may generate histogram data of a high bin resolution with a time accuracy of 8 bits (the period from time points 0 to TA may correspond to counting values 0 to 255).

Figure 9:
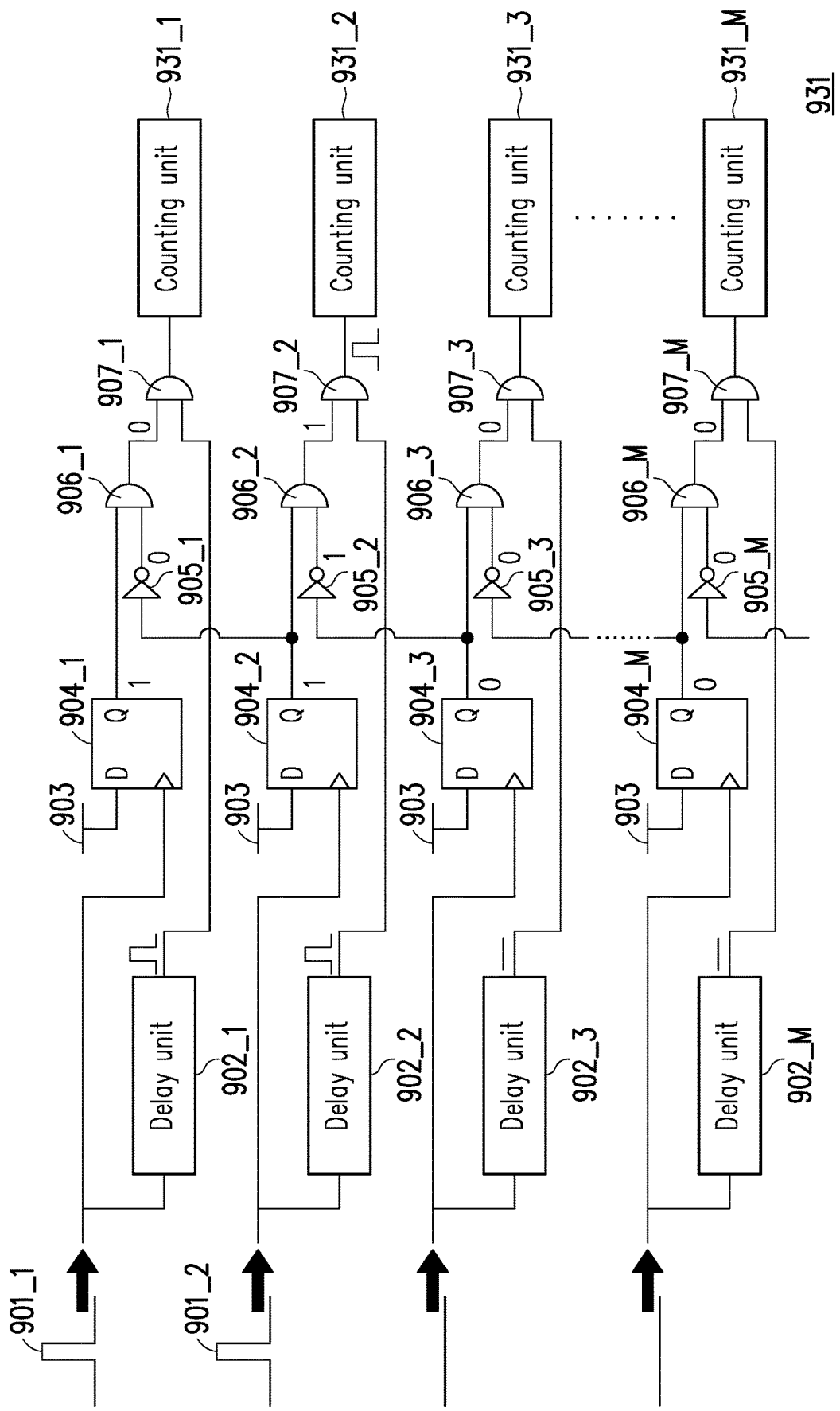
FIG. 9 is a schematic circuit diagram of a time-to-digital converter according to another embodiment of the disclosure.

FIG. 9 is a schematic circuit diagram of a counting circuit according to another embodiment of the disclosure. Referring to FIG. 6 and FIG. 9, step S540 of the above embodiment of FIG. 5 may be implemented by a circuit framework shown in FIG. 9, and the counting circuit 331 and the counting circuit 631 of FIG. 3 and FIG. 6 may further include the framework of a counting circuit 931 shown in FIG. 9. The sensing result of one sensing sub-pixel is taken as an example for description, so that the overall sensing result of the sensing array may be deduced by analogy as described below. In the embodiment, the counting circuit 931 may include a plurality of delay units 902_1-902_M, a plurality of flip-flops 904_1-904_M, a plurality of inverters 905_1-905_M, a plurality of first AND gates 906_1-906_M, a plurality of second AND gates 907_1-907_M, and a plurality of counting units 931_1-931_M. A plurality of first terminals of the delay units 902_1-902_M may be coupled to the second terminals of the second switches S1_1-S1_M in FIG. 6. A plurality of clock signal input terminals of the flip-flops 904_1-904_M are coupled to the second terminals of the second switches S1_1-S1_M, and a plurality of data input terminals of the flip-flops 904_1-904_M are coupled to a reference voltage 903. The flip-flops 904_1-904_M may be D-type flip-flops. A plurality of first input terminals of the first AND gates 906_1-906_M are coupled to a plurality of data output terminals of the flip-flops 904_1-904_M. A plurality of input terminals of the inverters 905_1-905_M are respectively coupled to a plurality of data output terminals of the inverters at the next level, and a plurality of output terminals of the inverters 905_1-905_M are coupled to a plurality of second input terminals of the first AND gates 906_1-906_M. A plurality of first input terminals of the second AND gates 907_1-907_M are coupled to a plurality of data output terminals of the first AND gates 906_1-906_M. A plurality of second input terminals of the second AND gates 907_1-907_M are coupled to a plurality of second terminals of the delay units 902_1-902_M, and a plurality of output terminals of the second AND gates 907_1-907_M are coupled to the counting units 931_1-931_M.

Figure 10:
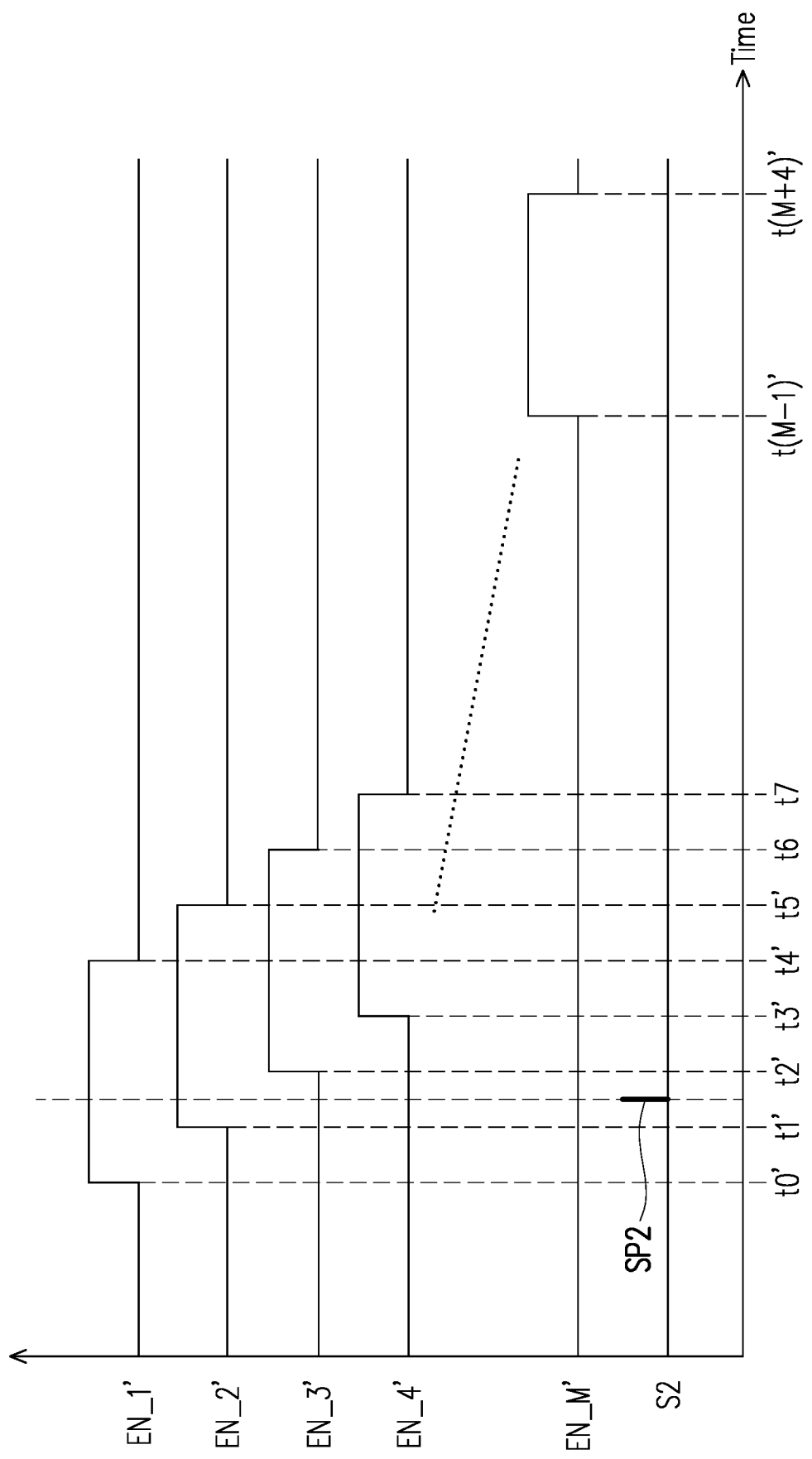
FIG. 10 is a signal timing diagram of a plurality of second switching signals and sensing signals according to another embodiment of the disclosure.

Referring to FIG. 10, FIG. 10 is a signal timing diagram of a plurality of second switching signals and sensing signals according to another embodiment of the disclosure. In the embodiment, the second switches S1_1-S1_M may receive second switching signals EN_1'-EN_M' as shown in FIG. 10, where a plurality of turn-on periods of at least part of the second switching signals EN_1'-EN_M' are partially overlapped. In this way, in collaboration with the operations of other second switches, a plurality of signal transmission paths between the counting units 931_1-931_M and the first switch SS may be closed sequentially during different periods, and several adjacent transmission paths may respectively have partially overlapped turn-on periods. For example, the signal transmission path between the counting unit 931_1 and the first switch SS may be closed during a period from a time point t0' to a time point t4'. The signal transmission path between the counting unit 931_2 and the first switch SS may be closed during a period from a time point t1' to a time point t5'. Deduced by analogy, the signal transmission path between the counting unit 931_M and the first switch SS may be closed during a period from a time point t(M−1)' to a time point t(M+4)'.

In this regard, when the first switch SS receives a pulse SP2 of a single photon sensing signal S2 provided by the diode of the sensing sub-pixel during the period from the time point t1' to the time point t2', as shown in FIG. 9, the second switch S1_1 outputs a sensing signal 901_1, and the second switch S1_2 outputs a sensing signal 901_2. The second switches S1_3-S1_M do not output signals. The delay unit 902_2 outputs a delayed sensing signal to the second input terminal of the second AND gate 907_2. The flip-flop 904_2 outputs a digital value "1" to the first input terminal of the first AND gate 906_2. Since the flip-flop 904_3 outputs a digital value "0", the inverter 905_2 outputs the digital value "1" to the second input terminal of the first AND gate 906_2. The output terminal of the first AND gate 906_2 outputs the digital value "1" to the first input terminal of the second AND gate 907_2. Therefore, the counting unit 931_2 may receive the sensing signal and increase the counting value (the counting value+1) according to the sensing signal. According to another aspect, the counting circuit 931 of the embodiment may automatically make the corresponding counting unit to correctly count according to the second switch that outputs the sensing signal last among the second switches S1_1-S1_M.

Compared to the second switching signals EN_1-EN_M in FIG. 7, the turn-on period of each of the second switching signals EN_1'-EN_M' shown in FIG. 10 may be four times of the turn-on period of each of the second switching signals EN_1-EN_M in FIG. 7. In other words, based on the design of the counting circuit 931 of the embodiment, the controller 633 of the time-to-digital converter 630 of the embodiment may use a lower speed clock signal to generate the second switching signals EN_1'-EN_M' as shown in FIG. 10. Therefore, the time-to-digital converter 630 of the embodiment may have lower hardware cost (the clock signal accuracy may be lower), but it may still achieve the histogram data of the counting result with high bin resolution as described in the embodiments of FIG. 6 and FIG. 7. It should be noted that since the clock signal is a relatively low-speed signal, the counting circuit 630 may be implemented by a low-speed circuit. In other words, the embodiment may greatly reduce an operating frequency of the time-to-digital converter circuit, and meanwhile reducing a design difficulty of the time-to-digital converter circuit.

Figure 11:
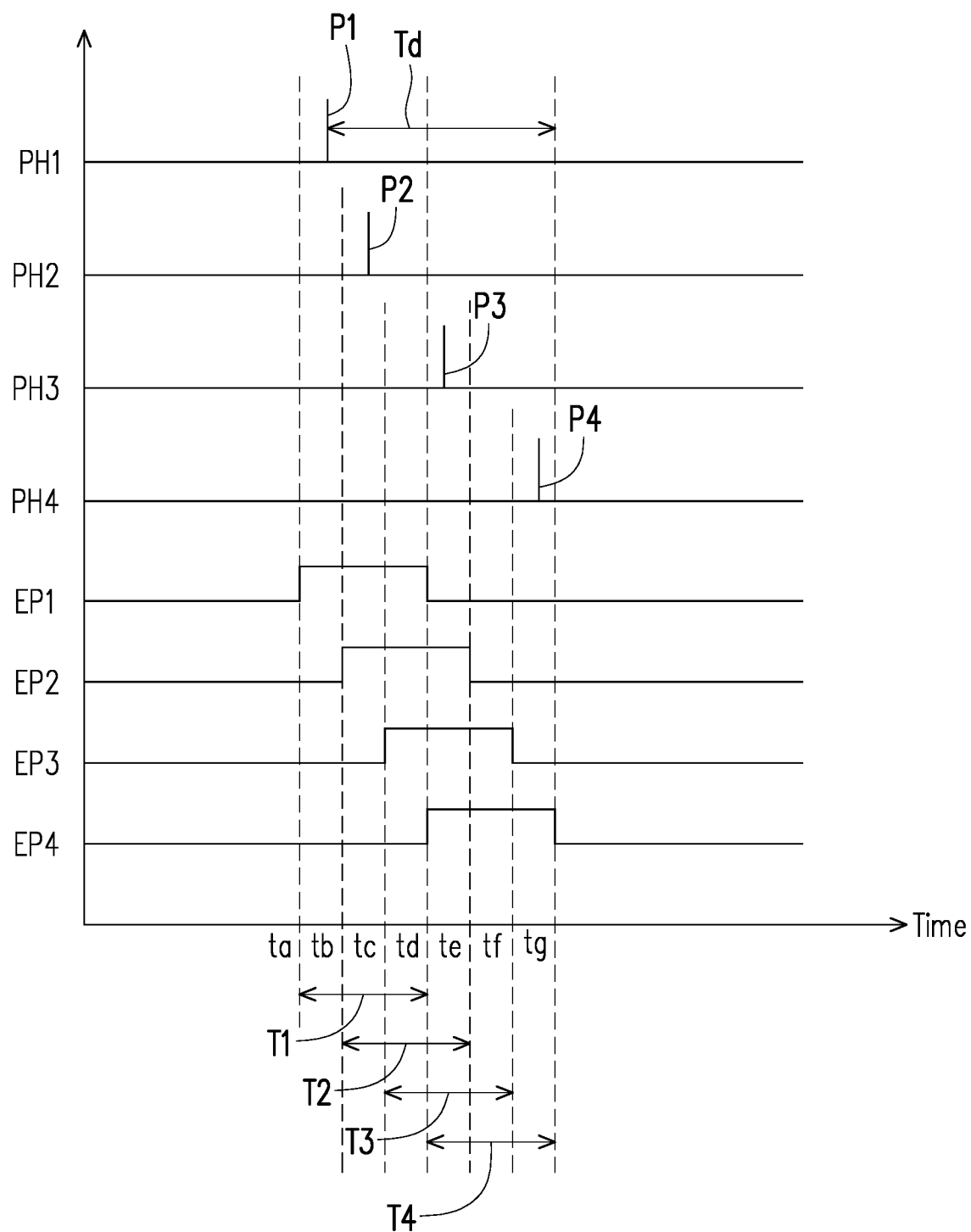
FIG. 11 is an operation timing diagram of a light sensor according to another embodiment of the disclosure.

FIG. 11 is an operation timing diagram of a light sensor according to another embodiment of the disclosure. Referring to FIG. 1, FIG. 2 and FIG. 11, it should be first noted that since the plurality of diodes of the sensing sub-pixels 121_1-121_N are respectively implemented by single photon avalanche diodes (operated in the Geiger mode or the avalanche linear mode)), when the plurality of diodes respectively sense photons to cause an avalanche event, the sensing sub-pixels 121_1-121_N must respectively re-bias the plurality of diodes, so that there will be a period of time when photons cannot be ranged (which may be referred to as a dead time). In this regard, in order to reduce an influence of the dead time, the control circuit 110 of the embodiment may, for example, set each of the sensing sub-pixels 121_1-121_N of the embodiment as a sensing pixel (or a macropixel). For example, referring to FIG. 2, four sensing sub-pixels 121_A-121_D may serve as one sensing pixel 122, where A~D are positive integers and less than or equal to N. The control circuit 110 may determine whether the sensing sub-pixels 121_A-121_D respectively sense one or a plurality of photons in a corresponding same exposure time interval to synchronously generate a plurality of sensing currents to serve as one pixel sensing result. For example, the control circuit 110 may calculate a distance sensing result (a time difference or a distance value) of the sensing sub-pixels 121_A-121_D to serve as one pixel sensing result.

To be specific, when the four diodes of the sensing sub-pixels 121_A-121_D are operated in the Geiger mode or the avalanche linear mode, the control circuit 110 may sequentially expose the sensing sub-pixels 121_A-121_D belonging to the same pixel during a frame sensing period between a time point ta and a time point tg. Shown as emission timings PH1-PH4 of the ranging light in FIG. 11, during the period from the time point ta to the time point tg, for example, four ranging light signals (photons) P1-P4 are emitted to the sensing pixel 122. Shown as exposure operation timings EP1-EP4 in FIG. 11, when the sensing sub-pixel 121_1 receives the ranging light signal P1 at the time point ta in an exposure period T1, the sensing sub-pixel 121_1 needs to go through a delay time Td before proceeding a next exposure operation. In this regard, if the exposure periods T2-T4 of the sensing sub-pixels 121_2-121_4 are the same as the exposure period T1, the sensing sub-pixels 121_1-121_4 may only receive the ranging light signal P1, and the ranging light signals P2-P4 will not be sensed due to that the sensing sub-pixels 121_1-121_4 are in the dead time.

Therefore, in the embodiment, an exposure start time of the exposure periods T2-T4 of the sensing sub-pixels 121_2-121_4 may be sequentially delayed to the time points tb-td, and the sequential two adjacent exposure periods of the exposure periods T1-T4 may be partially overlapped. In this way, the sensing sub-pixel 121_2 may receive the ranging light signal P2 between the time point tb and the time point tc in the exposure period T2. The sensing sub-pixel 121_3 may receive the ranging light signal P3 between the time point tc and the time point tf in the exposure period T3. The sensing sub-pixel 121_4 may receive the ranging light signal P4 between the time point td and the time point tg in the exposure period T4. Therefore, the sensing sub-pixels 121_2-121_4 may effectively receive all of the ranging light signals P1-P4, thereby reducing the influence of dead time and providing accurate sensing results.

In summary, the light sensor and the ranging method of the disclosure may effectively reduce a storage space requirement of the memory in the time-to-digital converter, and/or reduce an accuracy requirement of the clock signal, and/or reduce an operation frequency of the time-to-digital converter, and/or reduce the design difficulty of the time-to-digital converter circuit. Therefore, the light sensor and the ranging method of the disclosure may use the time-to-digital converter with lower cost to realize the histogram data of the counting results with high bin resolution.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A light sensor, comprising:
   a light source;
   a sensing sub-pixel, comprising a diode; and
   a control circuit, coupled to the light source and the sensing sub-pixel, and configured to operate the diode in a Geiger mode or an avalanche linear mode,
   wherein the control circuit comprises a time-to-digital converter coupled to the sensing sub-pixel, and the time-to-digital converter comprises:
      a counting circuit, coupled to the sensing sub-pixel, and comprising a plurality of counting units,
   wherein when the time-to-digital converter receives a sensing signal provided by the sensing sub-pixel, the time-to-digital converter generates a plurality of counting values according to the sensing signal through the counting units of the counting circuit, wherein the counting values are histogram data corresponding to a distance sensing result.

2. The light sensor as claimed in claim 1, wherein the time-to-digital converter further comprises a controller, a first switch, and a plurality of second switches,
   wherein a first terminal of the first switch is coupled to the sensing sub-pixel, a second terminal of the first switch is coupled to a first terminal of the second switches, and a second terminal of the second switches is coupled to the counting units,
   wherein the counting circuit outputs a first switching signal to the first switch, and the controller outputs a plurality of second switching signals to control the second switches,
   wherein when the sensing sub-pixel provides the sensing signal, the first switch is turned on and at least one of the second switches is turned on, so that the sensing signal is written into one of the counting units,
   wherein the sensing signal is a single photon sensing signal.

3. The light sensor as claimed in claim 2, wherein the second switches are coupled to form a tree structure.

4. The light sensor as claimed in claim 2, wherein a plurality of signal transmission paths respectively between the counting units and the first switch are sequentially closed in different periods.

5. The light sensor as claimed in claim 2, wherein the counting units are respectively an up counter.

6. The light sensor as claimed in claim 2, wherein the counting units output the counting values of a counting result of a plurality of single photon sensing signals of the sensing signal during a sensing period, so that the time-to-digital converter generates the histogram data corresponding to the distance sensing result according to the counting values.

7. The light sensor as claimed in claim 2, wherein the counting circuit further comprises:
   a plurality of delay units, wherein a plurality of first terminals of the delay units are coupled to the second terminal of the second switches;
   a plurality of flip-flops, wherein a plurality of clock signal input terminals of the flip-flops are coupled to the second terminal of the second switches, and a plurality of data input terminals of the flip-flops are coupled to a reference voltage;
   a plurality of first AND gates, wherein a plurality of first input terminals of the first AND gates are coupled to a plurality of data output terminals of the flip-flops;
   a plurality of inverters, wherein a plurality of input terminals of the inverters are respectively coupled to a a plurality of data output terminals of the inverters at a next level, and a plurality of output terminals of the inverters are coupled to a plurality of second input terminals of the first AND gates; and
   a plurality of second AND gates, wherein a plurality of first input terminals of the second AND gates are coupled to a plurality of data output terminals of the first AND gates, a plurality of second input terminals of the second AND gates are coupled a plurality of second terminals of the delay units, and a plurality of output terminals of the second AND gates are coupled to the counting units.

8. The light sensor as claimed in claim 7, wherein at least part of a plurality of turn-on periods of the second switching signals are partially overlapped.

9. The light sensor as claimed in claim 1, further comprising at least another sensing sub-pixel, wherein the sensing sub-pixel and the at least another sensing sub-pixel belong to a same pixel, and the sensing sub-pixel and the at least another sensing sub-pixel are sequentially exposed during a sensing period.

10. The light sensor as claimed in claim 9, wherein the sensing sub-pixel and the at least another sensing sub-pixel are partially overlapped during a plurality of exposure periods in the sensing period.

11. A ranging method, comprising:
   operating a diode of a sensing sub-pixel in a Geiger mode or an avalanche linear mode;
   emitting ranging light by a light source;
   sensing reflected light corresponding to the ranging light through the sensing sub-pixel; and
   when a time-to-digital converter receives a sensing signal provided by the sensing sub-pixel, generating a plurality of counting values according to the sensing signal through a plurality of counting units of a counting circuit, wherein the counting values are histogram data corresponding to a distance sensing result.

12. The ranging method as claimed in claim 11, wherein the time-to-digital converter further comprises a controller, a first switch, and a plurality of second switches,
   wherein a first terminal of the first switch is coupled to the sensing sub-pixel, a second terminal of the first switch is coupled to a first terminal of the second switches, and a second terminal of the second switches is coupled to the counting units,
   wherein the counting circuit outputs a first switching signal to the first switch, and the controller outputs a plurality of second switching signals to control the second switches,
   wherein when the sensing sub-pixel provides the sensing signal, the first switch is turned on and at least one of the second switches is turned on, so that the sensing signal is written into one of the counting units, wherein the sensing signal is a single photon sensing signal.

13. The ranging method as claimed in claim 12, wherein the second switches are coupled to form a tree structure.

14. The ranging method as claimed in claim 12, wherein a plurality of signal transmission paths respectively between the counting units and the first switch are sequentially closed in different periods.

15. The ranging method as claimed in claim 12, wherein the counting units are respectively an up counter.

16. The ranging method as claimed in claim 12, wherein the counting units output the counting values of a counting result of a plurality of single photon sensing signals of the sensing signal during a sensing period, so that the time-to-digital converter generates the histogram data corresponding to the distance sensing result according to the counting values.

17. The ranging method as claimed in claim 12, wherein the counting circuit further comprises:
   a plurality of delay units, wherein a plurality of first terminals of the delay units are coupled to the second terminal of the second switches;
   a plurality of flip-flops, wherein a plurality of clock signal input terminals of the flip-flops are coupled to the second terminal of the second switches, and a plurality of data input terminals of the flip-flops are coupled to a reference voltage;
   a plurality of first AND gates, wherein a plurality of first input terminals of the first AND gates are coupled to a plurality of data output terminals of the flip-flops;
   a plurality of inverters, wherein a plurality of input terminals of the inverters are respectively coupled to a plurality of data output terminals of the inverters at a next level, and a plurality of output terminals of the inverters are coupled to a plurality of second input terminals of the first AND gates; and
   a plurality of second AND gates, wherein a plurality of first input terminals of the second AND gates are coupled to a plurality of data output terminals of the first AND gates, a plurality of second input terminals of the second AND gates are coupled a plurality of second terminals of the delay units, and a plurality of output terminals of the second AND gates are coupled to the counting units.

18. The ranging method as claimed in claim 17, wherein at least part of a plurality of turn-on periods of the second switching signals are partially overlapped.

19. The ranging method as claimed in claim 11, further comprising at least another sensing sub-pixel, wherein the sensing sub-pixel and the at least another sensing sub-pixel belong to a same pixel, and the sensing sub-pixel and the at least another sensing sub-pixel are sequentially exposed during a sensing period.

20. The ranging method as claimed in claim 19, wherein the sensing sub-pixel and the at least another sensing sub-pixel are partially overlapped during a plurality of exposure periods in the sensing period.

\* \* \* \* \*